US009646896B2

(12) United States Patent
Hsieh et al.

(10) Patent No.: US 9,646,896 B2
(45) Date of Patent: *May 9, 2017

(54) LITHOGRAPHIC OVERLAY SAMPLING

(71) Applicant: Taiwan Semiconductor Manufacturing Co., Ltd., Hsin-Chu (TW)

(72) Inventors: Yi-Ping Hsieh, Hsinchu (TW); Yung-Yao Lee, Zhubei (TW); Ying Ying Wang, Xin-Zhu (TW); Shin-Rung Lu, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 607 days.

This patent is subject to a terminal disclaimer.

(21) Appl. No.: 13/940,355

(22) Filed: Jul. 12, 2013

(65) Prior Publication Data
US 2015/0016943 A1    Jan. 15, 2015

(51) Int. Cl.
*G01B 11/00* (2006.01)
*H01L 21/66* (2006.01)
*G03F 7/20* (2006.01)
*G01B 11/14* (2006.01)

(52) U.S. Cl.
CPC .......... *H01L 22/20* (2013.01); *G03F 7/70633* (2013.01); *G01B 11/14* (2013.01)

(58) Field of Classification Search
CPC ............................ H01L 22/20; G03F 7/70633
USPC ........................................................ 356/399
See application file for complete search history.

(56) References Cited

U.S. PATENT DOCUMENTS

| | | | | | |
|---|---|---|---|---|---|
| 4,780,617 A | * | 10/1988 | Umatate | ............... | G03F 9/7003 250/548 |
| 5,757,015 A | * | 5/1998 | Takemoto | ............... | B82Y 10/00 250/491.1 |
| 6,136,517 A | * | 10/2000 | Fletcher | ............... | G03F 7/70475 430/312 |

(Continued)

OTHER PUBLICATIONS

Aaron R. Hawkins; "Contact Photolithographic Alignment Tutorial"; Alignment Tutorial; Electrical and Computer Engineering Departmnet, Brigham Young University; Jan. 2004, p. 1-9.

(Continued)

*Primary Examiner* — Hina F Ayub
(74) *Attorney, Agent, or Firm* — Eschweiler & Potashnik, LLC

(57) ABSTRACT

Some embodiments of the present disclosure relate to a method of alignment which includes defining a plurality of fields on the face of a wafer, and organizing the plurality of fields into an orthogonal field structure and two or more continuous field structures. A first number of alignment structure positions are measured within each field of the two or more continuous field structures, and a second number of alignment structure positions are measured within each field of the orthogonal field structure, the second number being greater than the first number. The feature or layer is then aligned to the previously formed feature or layer based upon the measured alignment structure positions of the two or more continuous field structures and the orthogonal field structure.

20 Claims, 7 Drawing Sheets

(56) References Cited

U.S. PATENT DOCUMENTS

| | | | |
|---|---|---|---|
| 7,780,893 B2* | 8/2010 | Sreenivasan | B29C 43/003 264/293 |
| 9,176,396 B2* | 11/2015 | Lee | G03F 7/70633 |
| 2002/0157075 A1* | 10/2002 | Teig | G06F 17/5077 716/122 |
| 2005/0048654 A1* | 3/2005 | Wu | G03F 7/70633 436/5 |
| 2005/0188342 A1* | 8/2005 | Goodwin | G03F 7/70633 430/22 |
| 2007/0157139 A1* | 7/2007 | White | G03F 1/36 700/97 |
| 2013/0310966 A1* | 11/2013 | MacNaughton | G03F 7/70525 700/121 |

OTHER PUBLICATIONS

Mike Adel, et al; "Overlay & CD Metrology Challenges for DPT" KLA-Tencor Accelerating Yield, May 2008, p. 1-21.

* cited by examiner

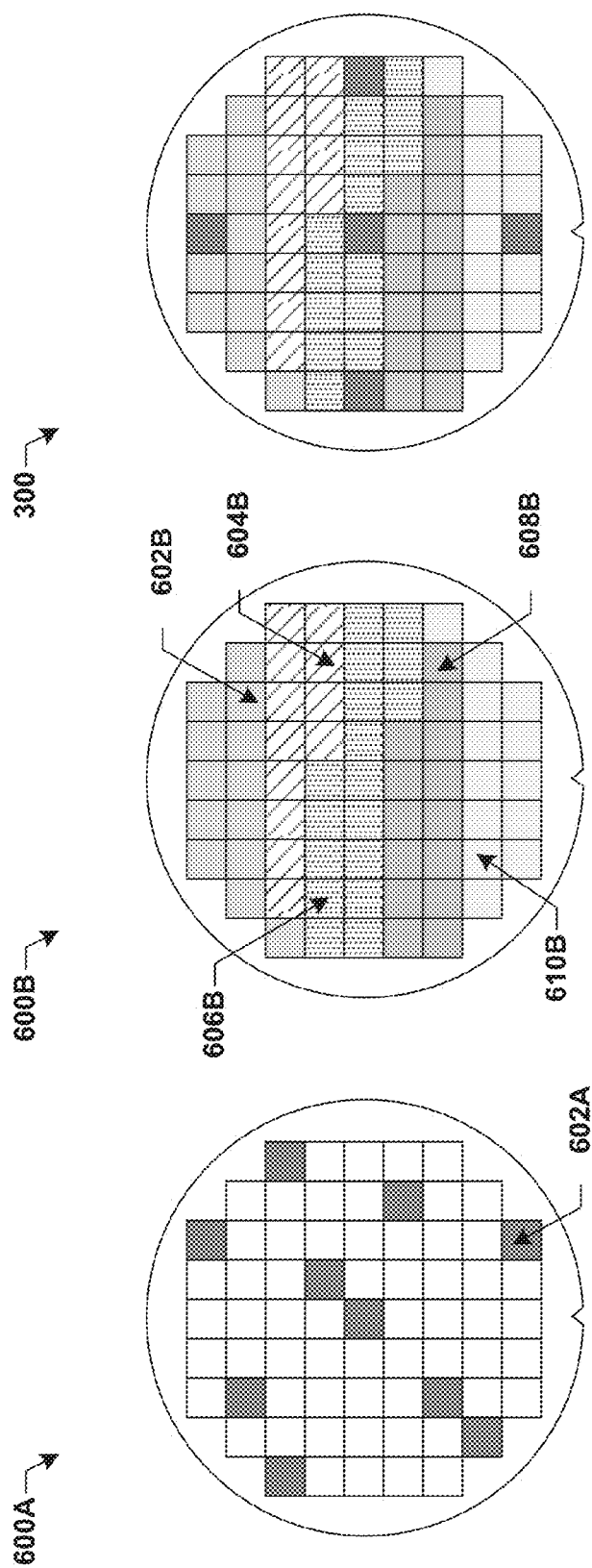

LITHOGRAPHIC OVERLAY SAMPLING

BACKGROUND

The following disclosure relates to overlay metrology and methods to achieve enhanced overlay control between two or more alignment events while maintaining manufacturing throughput for semiconductor fabrication process.

BRIEF DESCRIPTION OF THE DRAWINGS

FIGS. 6A-6C illustrate a comparison of some methods alignment structure measurements with an embodiment of the present disclosure.

DETAILED DESCRIPTION

Figure 1:
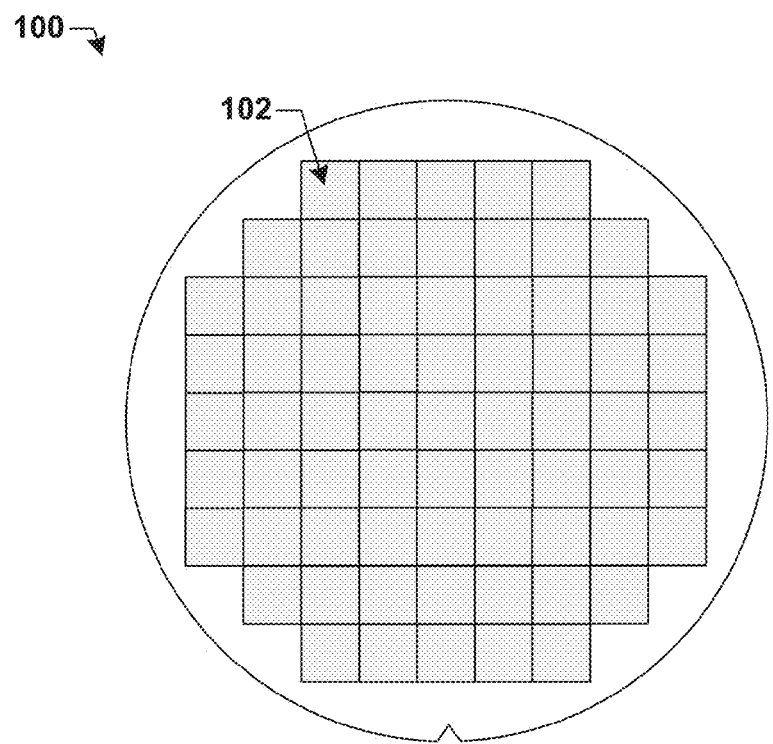
FIG. 1 illustrates a patterned wafer consisting of a periodic array of reticle fields.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Semiconductor devices on silicon wafers are manufactured in a sequence of successive lithography steps comprising mask alignment, exposure, and photoresist development to form a pattern which defines areas on the silicon wafers for device structures and interconnects. The patterns are formed on the silicon wafer in alignment with other existing features on the silicon wafer according to overlay/alignment structures. In some circumstances, the patterns are formed on the silicon wafer in alignment with other patterns, for example, in a double patterning process. Double-patterning (DP) lithography processes allow for a reduced feature pitch over single-exposure techniques but may be subject to additional process variation due to mask overlay (OVL) variability. Additionally, effects such as thermal cycling of the wafer during manufacturing of the IC can distort an ideally flat wafer surface and form wafer topologies which may also degrade OVL control by distorting alignment structure locations from their designated locations when aligning to a surface of the wafer.

To mitigate OVL variability and facilitate robust mask alignment, dedicated alignment structures are placed within physical layout data of the IC, and are utilized by an in-line alignment tool within a semiconductor fabrication (FAB) flow to achieve OVL control during mask alignment. As the number of alignment structure positions which are sampled in-line increases an increasingly accurate depiction of the wafer topology may be achieved, resulting in an increased accuracy in mask alignment. However, increasing the number of sampled alignment structure sites degrades manufacturing throughput of the FAB. As such, only a subset of alignment structure locations may be sampled, thus degrading OVL accuracy. A shift from 300 mm wafers to 450 mm in next-generation technology node manufacturing also drives a need for enhanced OVL control over some prior art methods.

Accordingly, some embodiments of the present disclosure relate to a method of aligning a pattern of a feature or layer with a previously formed feature or layer on a face of the wafer. The method includes defining a plurality of fields on the face of the wafer, and organizing the plurality of fields into an orthogonal field structure and two or more continuous field structures, wherein the orthogonal field structure is made up of fields which reside on first and second orthogonal axes and which are arranged near an outer edge of the wafer, and wherein each continuous field structure includes two or more adjacent fields that are separate from the orthogonal field structure. A first number of alignment structure positions are measured within each field of the two or more continuous field structures, and a second number of alignment structure positions are measured within each field of the orthogonal field structure, the second number being greater than the first number. The feature or layer is then aligned to the previously formed feature or layer based upon the measured alignment structure positions of the two or more continuous field structures and the orthogonal field structure.

FIG. 1 illustrates a patterned wafer 100 (e.g., Si or silicon-on-insulator (SOI)) consisting of a periodic array of reticle fields 102. In some embodiments, each reticle field 102 contains an IC which is patterned by a step-and-repeat tool configured align a patterned mask to an individual reticle field 102 based upon a wafer map of alignment structure locations obtained from physical layout data of the IC. In some embodiments, the physical layout data of the IC comprises a GL1, OASIS, or GDSII format, is created in a CADENCE VIRTUOSO or MENTOR GRAPHICS design window, and is assembled into the into a wafer-level periodic array of reticle fields 102 comprising one or more alignment structures within each reticle field 102.

Figure 2:
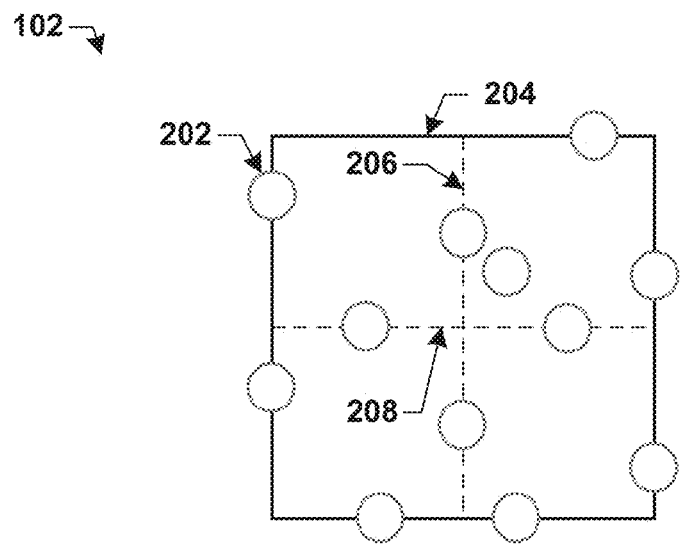
FIG. 2 illustrates a reticle field containing a plurality of alignment structures.

FIG. 2 illustrates the reticle field 102 containing a configuration of alignment structures 202. In some embodiments the locations of the alignment structure sites are determined randomly. In some embodiments the locations of the alignment structure sites are determined from locations and types of feature or layer or the previously formed feature or layer to aid in yield and performance of the device formed from the feature or layer. For instance, a site for an alignment structure 202 may be chosen to be in a region of a thick oxidation shape to insure robust alignment when a mask comprising the oxidation shape is aligned to a previously formed feature within the region. Other features or layers may include gate poly silicon, oxide definition shapes for source/drain formation, local interconnect shapes, via and contact shapes, and metallization shapes among others. In some embodiments, the locations of the alignment structure sites are chosen to coincide with a boundary 204 of the reticle field 102, a first orthogonal centerline 206, or a second orthogonal centerline 208. In some embodiments, the reticle field 102 contains additional metrology structures for additional overlay (OVL) control during a mask alignment event, to monitor critical dimension (CD) variation of layout topologies across a plurality of reticle fields disposed on a surface of the wafer.

Figure 3:
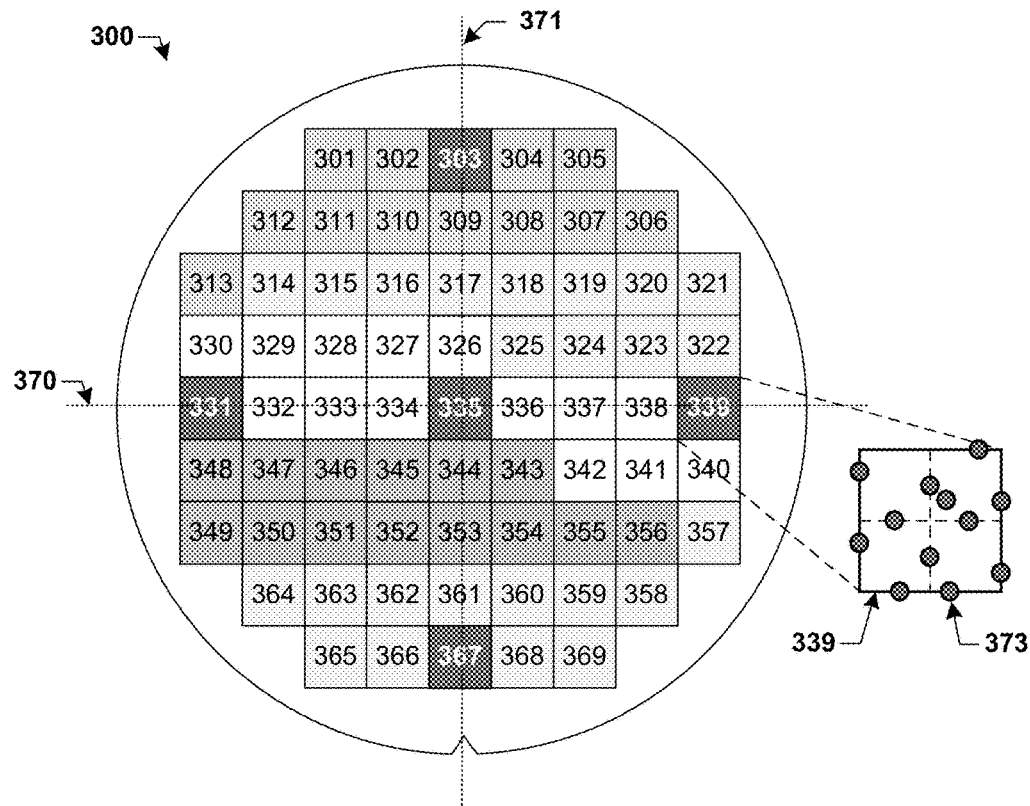
FIG. 3 illustrates some embodiments of a wafer containing a plurality of fields which have been partitioned into a plurality of continuous field structures and an orthogonal field structure.

FIG. 3 illustrates some embodiments of a wafer 300 containing a plurality of fields 301-369 disposed on a face of the wafer 300 which have been partitioned into a plurality of continuous field structures and an orthogonal field structure. The continuous field structures comprise: a first continuous field structure consisting of fields 301-302 and 304-313, a second continuous field structure consisting of fields 314-325, a third continuous field structure consisting of fields 326-330, 332-334, 336,338, and 340-442, a fourth continuous field structure consisting of fields 343-356, and a fifth continuous field structure consisting of fields 357-366, 368, and 369. The first through fifth continuous field structures include adjacent fields that are separate from the orthogonal field structure, and form shapes which are asymmetric about first and second orthogonal axes 370, 371. The orthogonal field structure is made up of fields 303, 331, 339, and 367 which reside on the first and second orthogonal axes 370, 371 and which are arranged near an outer edge of the wafer 300. In general, the orthogonal field structure contains at least four fields. For the embodiments of FIG. 3, the orthogonal field structure further comprises a fifth field 335 at a center of the wafer and at which the first and second orthogonal axes 370, 371 intersect.

The first through fifth continuous field structures each include a predetermined number of fields: the first continuous field structure consists of 12 fields, the second continuous field structure consists of 12 fields, the third continuous field structure consists of 14 fields, the fourth continuous field structure consists of 14 fields, and the fifth continuous field structure consists of 12 fields. For the embodiments of FIG. 3, the number of fields within a continuous field structure is greater than or equal to a number of alignment structure sites within a field. For the embodiments of FIG. 3, the predetermined number of fields for a continuous field structure are arranged to include consecutive adjacent fields in a direction of the first orthogonal axis 370 (e.g., horizontal). Fields 301-305 form a first row arranged horizontally. Similarly, fields 306-312 form a second row which is also arranged horizontally. Field 313 is the final field of the first continuous field structure, and populates a first location in the third row, which is the next location the arrangement along the first orthogonal axis 370 after all field sites in the second row have been populated. The second through fifth continuous field structures are similarly arranged.

An exploded view of field 339 is shown, and includes 12 alignment structures 373 distributed therein. For the embodiments of FIG. 3, the alignment structure position of all alignment structures are measured within the orthogonal field structure, whereas only a single alignment structure position is measured within each field of the first through fifth continuous field structures.

Figure 4:
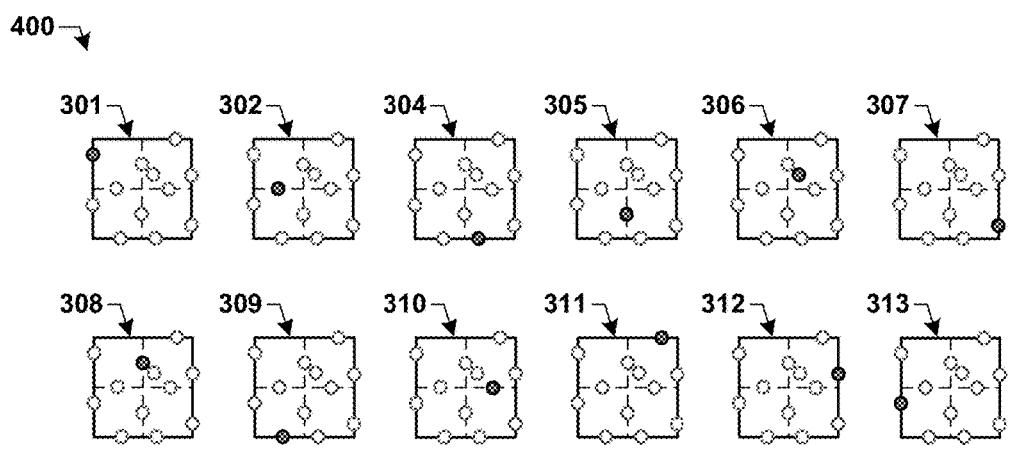
FIG. 4 illustrates some embodiments of alignment structure site variation within a continuous field structure.

FIG. 4 illustrates a collection of sites 400 from the first continuous field structure of the embodiments of FIG. 3, consisting of fields 301-302 and 304-313 which each contain a fixed number of alignment structure sites that are clustered in an identical configuration within each field. For the embodiments of FIG. 4, only a single alignment structure position (shown as the shaded alignment structure) is measured from the set of a fixed number of alignment structure sites within each field. Furthermore, a different alignment structure site is measured within each field within the first continuous field structure until all of the alignment site positions have been measured within the first continuous field structure. For a continuous field structure comprising greater than 12 fields (e.g., the third or fourth continuous field structure) redundant alignment structure sites are sampled once each alignment structure site has been sampled at least once.

Figure 5:
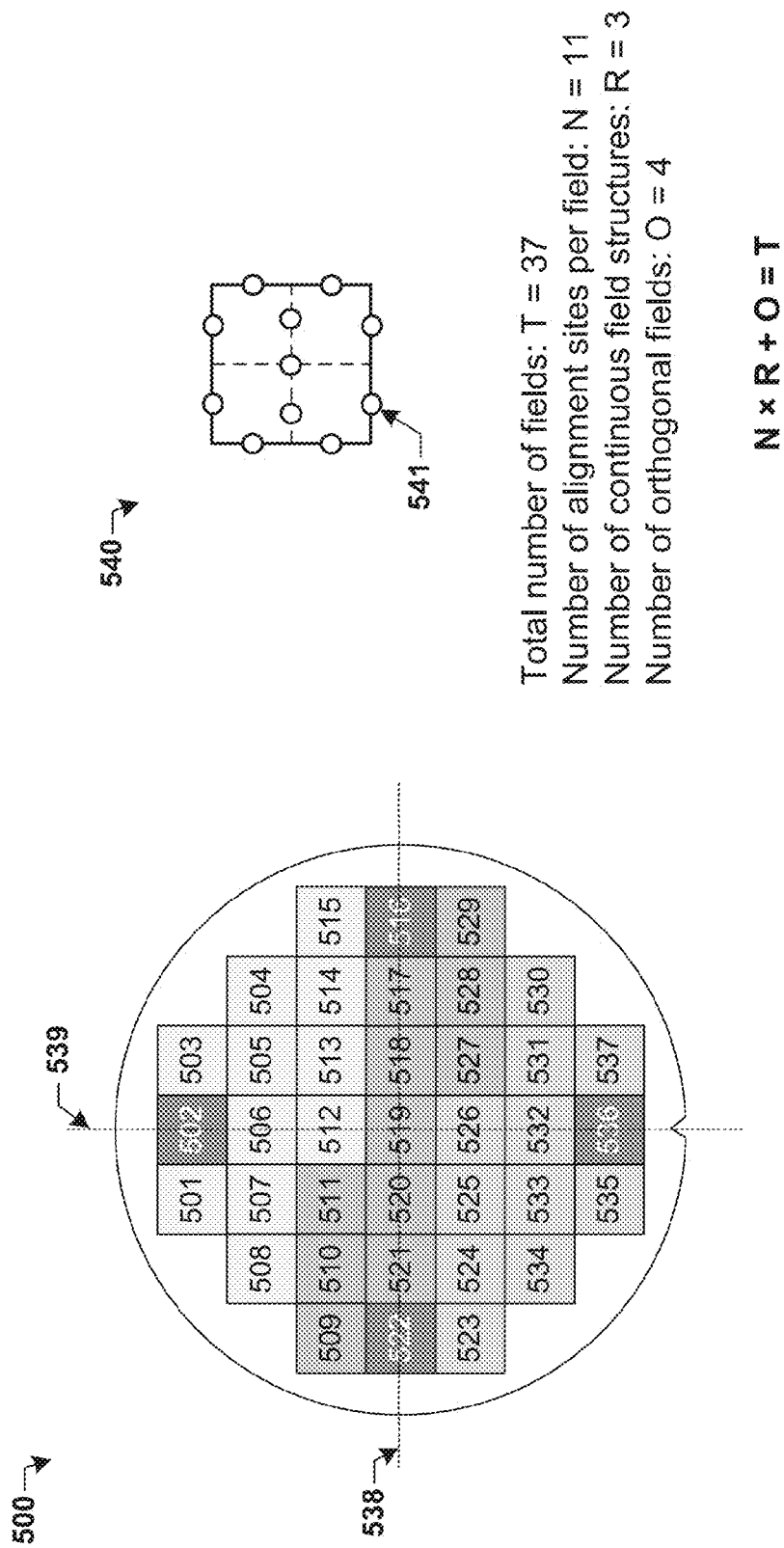
FIG. 5 illustrates some embodiments of an exemplary partitioning of a wafer into a plurality of continuous field structures.

FIG. 5 illustrates some embodiments of an exemplary partitioning of a wafer 500 into a plurality of continuous field structures: a first continuous field structure consisting of fields 501, 503-508, and 512-515, a second continuous field structure consisting of fields 509-511, 517-521, and 527-529, and a third continuous field structure consisting of fields 523-526, 530-534, 535, and 537. The first through third continuous field structures each contain 11 fields. The wafer is also partitioned into an orthogonal field structure, which is made up of (O=4) fields 502, 516, 522, and 536 which reside on first and second orthogonal axes 538, 539 and which are arranged near an outer edge of the wafer.

For the embodiments of FIG. 5, a first number of alignment structure positions are measured within each field of the first through third continuous field structures, and a second number of alignment structure positions are measured within each field of the orthogonal field structure. The second number being greater than the first number. It is appreciated to one of ordinary skill in the art that the first and second numbers are chosen to trade off between manufacturing throughput of wafer sampling within an in-line FAB flow and OVL accuracy. For some embodiments of the present invention, the first number is between one and three for each field of the first through third continuous field structures, and the second number is four or more for each field of the orthogonal field structure.

For the embodiments of FIG. 5, the total number of fields (T) on the wafer 500 is 37. Each field contains an identical alignment structure configuration 540 which contains (N=11) alignment structure sites, which is also equal to the number of fields within each of the (R=3) continuous field structures. As a result, a sum of a product of the number of continuous field structures (R) and the number of alignment structure sites (N) and a number of orthogonal fields (O) is equal to a total number of fields (T) on the wafer, $$N \times R + O = T.$$

FIGS. 6A-6C illustrate a comparison of some methods alignment structure measurements with an embodiment of the present disclosure. A first wafer 600A of FIG. 6A contains 69 fields, each field containing an identical configuration of 12 alignment structures. A total of 10 sampled fields 602A are sampled during an alignment event utilizing a first method, wherein all 12 alignment structures within a sampled field 602A prior to wafer alignment, resulting in 10×12=120 sampled sites per the first wafer 600A or approximately 15% sampling coverage of the fields. The first method is indicative of some prior art approaches and may be demonstrated to provide a residual offset after alignment symmetry operations of approximately 0.25 nm.

A second wafer 600B of FIG. 6B also contains 69 fields, each field containing an identical configuration of 12 alignment structures. The 69 fields are organized into first through fifth continuous field structures 602B-610B. Each of the 69 fields of FIG. 6B are sampled at least once during an alignment event utilizing a second method, where each of the 12 alignment structure sites within the configuration are sampled at least once within each continuous field structure, resulting in 69 sampled sites per the second wafer 600B for 100% sampling coverage of the fields. Note that the second method utilizes approximately half the sampling sites per wafer as the first method, thus allowing for approximately twice the throughput.

FIG. 6C illustrates the embodiments of the wafer 300, also containing 69 fields which are configured in the manner as describe in FIG. 3. The first through fifth continuous field structures are each sampled once in accordance with the embodiments of FIG. 4, wherein a different alignment structure site is measured within each field within a continuous field structure until all of the alignment site positions have been measured within the continuous field structure, resulting in 64 sampled sites within the first through fifth continuous field structures. The alignment structure position four of the alignment structure sites are measured within the five fields of the orthogonal field structure, resulting in 20 sampled sites for the orthogonal field structure. As a result, a third method including the embodiments of FIG. 6C results in 84 sampled sites on the wafer 300 for 100% sampling coverage of the fields. Note that the third method utilizes approximately two thirds of the sampling sites per wafer as the first method, thus allowing for approximately 50% higher throughput. The first method is indicative of some embodiments of the present disclosure and may be demonstrated to provide a residual offset after alignment symmetry operations of approximately 0.14 nm.

Figure 7A:
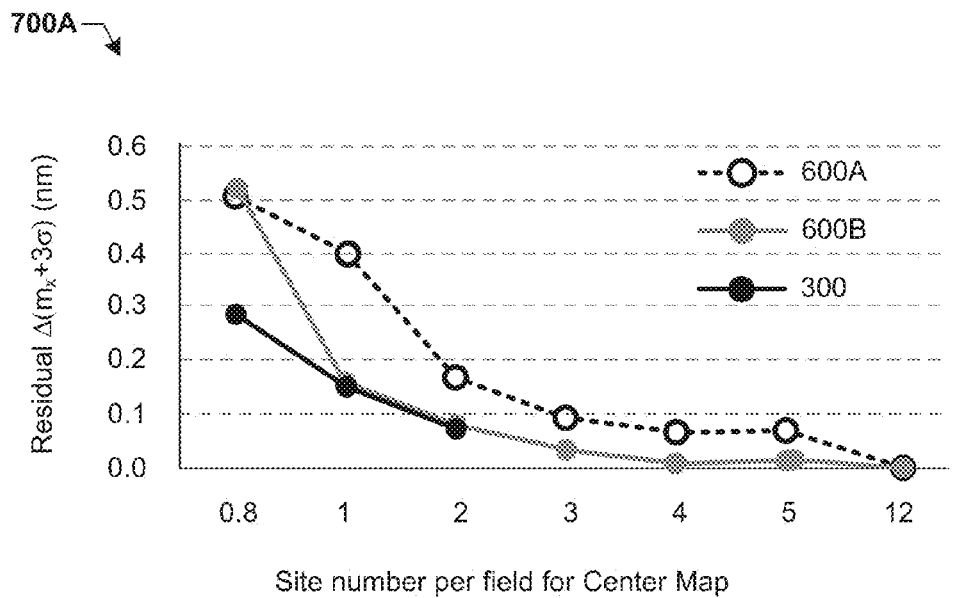
FIGS. 7A-7B illustrate graphs of residual offsets measured for the methods of FIGS. 6A-6C.
Figure 7B:
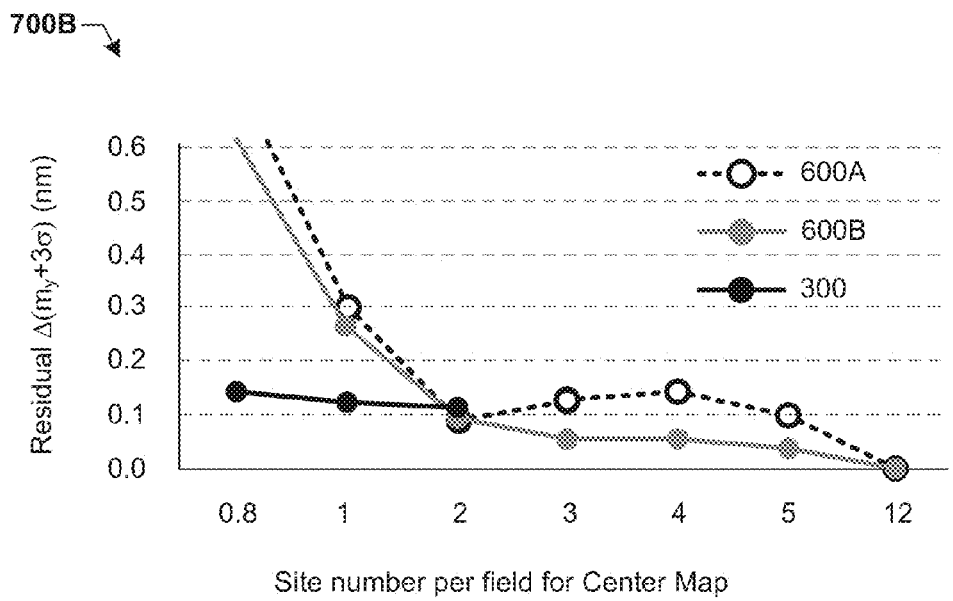

FIGS. 7B-7B illustrate graphs of residual offsets measured for the methods of FIGS. 6A-6C as a function of sampled sites per field in a first orthogonal direction (e.g., x, horizontal) for a first graph 700A and a second orthogonal direction (e.g., y, vertical) for a second graph 700B. The residual is calculated by considering misalignment between each alignment structure and their previously formed alignment structure a face of the wafer after an alignment event consisting of symmetry operations on the wafer including rotation about 3 axes, translation, or combinations thereof.

Figure 8:
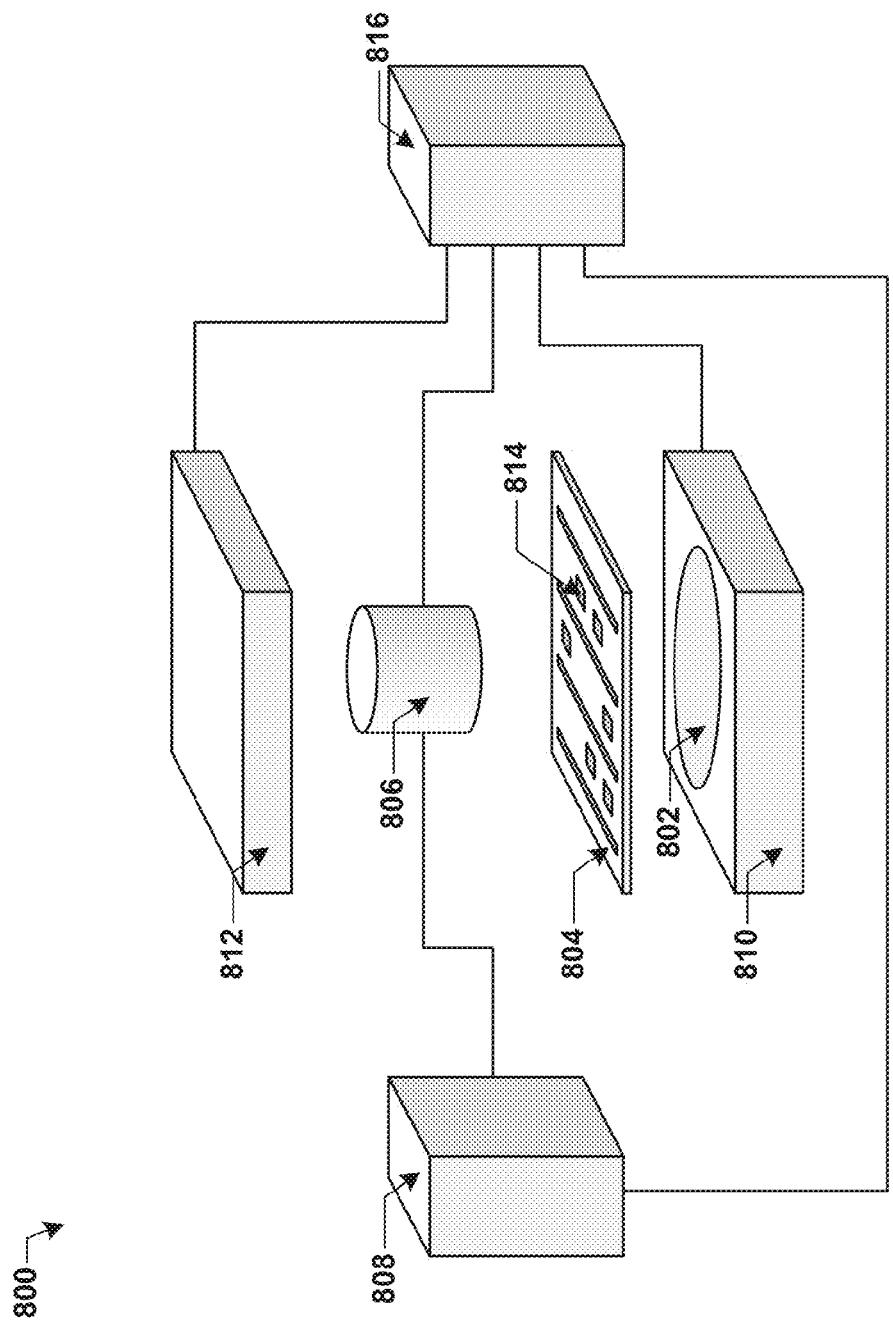
FIG. 8 illustrates some embodiments of a metrology system configured to operate in accordance with the embodiments of the present disclosure.

FIG. 8 illustrates some embodiments of a metrology system 800 configured to operate in accordance with the embodiments of the present disclosure. The metrology system 800 is configured to measure alignment structure locations within a wafer 802 comprising a plurality of fields and align a patterning apparatus 804 to the wafer 802 in manner which minimizes a residual offset between modeled alignment structure positions of a modeled wafer map and measured alignment structure positions of a measured wafer map which are measured by a measurement tool 806. The measurement tool 806 is configured to measure an alignment structure position within a field on a surface of the wafer 802, where each field of the wafer 802 comprises an identical configuration of alignment structure sites.

The metrology system 800 further comprises a computational unit 808 configured to organize the plurality of fields into two or more continuous field structures, and instruct the measurement tool 806 to measure an alignment structure site as a function of a field or continuous field structure within which the alignment structure site is located to provide a complete sampling of all alignment structure site positions within a continuous field structure. The computational unit 808 is further configured to compile the measured wafer map by measuring the alignment structure positions, to compile the modeled wafer map by extrapolating the measured surface topography of the wafer 802 for un-measured alignment structure sites. The modeled wafer map can be utilized by an alignment stage 810 which is coupled to the computational unit 808 and configured to align the wafer 802 to an exposure tool 812 utilizing symmetry operations performed on the wafer 802. The exposure tool 812 is configured to provide electromagnetic radiation which is filtered by the patterning apparatus 804 (e.g., a quartz photomask). The patterning apparatus 804 contains a pattern defined by opaque areas and transparent areas 814 of the patterning apparatus 804, where light passes through the transparent areas 814 to form a pattern of developed photoresist on a surface of the wafer 802.

In some embodiments, the exposure tool 812 comprises a step-and-repeat tool utilized to align the patterning apparatus 804 with the origin position of a field, and expose to a light source to form a pattern within the field before "stepping" to a next periodic location of a field on the wafer 802. The computational unit 808, alignment stage 810, and exposure tool 812 are controlled by a controller 816 which positions the exposure tool 812 over the wafer 802 in accordance with the modeled wafer map provided by the computational unit 808 in a manner which minimizes residual offset between features or layers formed by the patterning apparatus 804 and previously-formed features or layers on the surface of the wafer 802.

For the embodiments of FIG. 8, the measured surface topography is generated by the measured alignment structure positions which provide at least a single datum for each field. Ideally the wafer 802 is flat and perfect alignment to 100% of the alignment structures is possible. However, in practice topographical variations of the wafer 802 will distort the alignment structure positions such that perfect alignment is not possible. This distortion of the topography can result from thermal effects such as thermal cycling of the wafer, mechanical effects such as chemical mechanical polishing (CMP) or etching, electromagnetic effects such as deformation due to an electric potential, or other process steps involving thermal cycling, etc.

Figure 9:
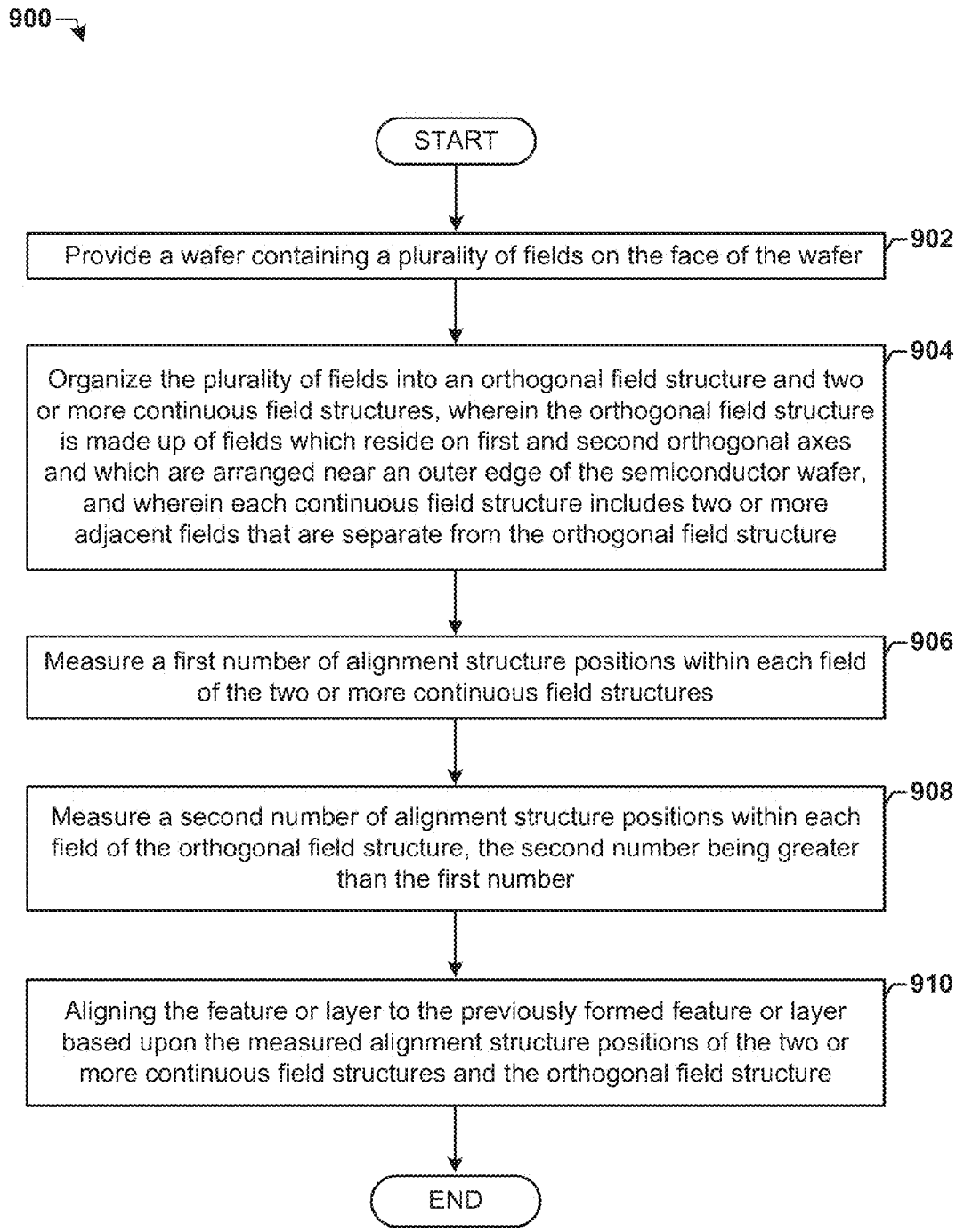
FIG. 9 illustrates some embodiments of a method of mask alignment.

FIG. 9 illustrates some embodiments of a method 900 of mask alignment. While the method 900 is illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902 a wafer containing a plurality of fields on the face of the wafer is provided.

At 904 the plurality of fields are organized into an orthogonal field structure and two or more continuous field structures. The orthogonal field structure is made up of fields which reside on first and second orthogonal axes and which are arranged near an outer edge of the wafer. Each continuous field structure includes two or more adjacent fields that are separate from the orthogonal field structure.

At 906 a first number of alignment structure positions are measured within each field of the two or more continuous field structures. In some embodiments, a single alignment structure position is measured within each field of the two or more continuous field structures, where the measured alignment structure positions comprise a subset of a fixed number of alignment structure sites within each field, and where the fixed number of alignment structure sites comprise an identical configuration within each field. In some embodiments, measuring one alignment structure position within each field within a continuous field structure further comprises measuring a different alignment structure site within each field within the continuous field structure until all of the alignment site positions have been measured within the continuous field structure.

At 908 a second number of alignment structure positions are measured within each field of the orthogonal field structure. The second number is greater than the first number, and in some embodiments is four or greater to provide a representation of the plane of the wafer. In some embodiments, the alignment structure position of all alignment structure sites are measured within the orthogonal field structure.

At 910 the feature or layer is aligned to the previously formed feature or layer based upon the measured alignment structure positions of the two or more continuous field structures and the orthogonal field structure.

Therefore, it will be appreciated that some embodiments of the present disclosure relate to a method and apparatus to achieve OVL sampling within a wafer containing plurality of adjacent reticle fields while aligning a feature or layer with a previously formed feature or layer on a face of the wafer. The method includes defining a plurality of fields on the face of the wafer, and organizing the plurality of fields into an orthogonal field structure and two or more continuous field structures, wherein the orthogonal field structure is made up of fields which reside on first and second orthogonal axes and which are arranged near an outer edge of the wafer, and wherein each continuous field structure includes two or more adjacent fields that are separate from the orthogonal field structure. A first number of alignment structure positions are measured within each field of the two or more continuous field structures, and a second number of alignment structure positions are measured within each field of the orthogonal field structure, the second number being greater than the first number. The feature or layer is then aligned to the previously formed feature or layer based upon the measured alignment structure positions of the two or more continuous field structures and the orthogonal field structure.

In some embodiments, method of aligning a feature or layer with a previously formed feature or layer on a face of the wafer is disclosed. The method comprises defining a plurality of fields on the face of the wafer, and organizing the plurality of fields into an orthogonal field structure and two or more continuous field structures, wherein the orthogonal field structure is made up of fields which reside on first and second orthogonal axes and which are arranged near an outer edge of the wafer, and wherein each continuous field structure includes two or more adjacent fields that are separate from the orthogonal field structure. The method further comprises measuring a first number of alignment structure positions within each field of the two or more continuous field structures, and measuring a second number of alignment structure positions within each field of the orthogonal field structure, the second number being greater than the first number. An alignment of the feature or layer to the previously formed feature or layer is performed based upon the measured alignment structure positions of the two or more continuous field structures and the orthogonal field structure.

In some embodiments, a method of alignment on a wafer comprising a plurality of adjacent fields on a face of the wafer is performed. The method comprises organizing the plurality of adjacent fields into an orthogonal field structure and two or more continuous field structures, wherein the orthogonal field structure is made up of fields which reside on first and second orthogonal axes and which are arranged near an outer edge of the wafer and at the center of the wafer, and wherein each continuous field structure includes two or more adjacent fields that are separate from the orthogonal field structure. The method further comprises measuring at least one alignment structure position within each field of the two or more continuous field structures, measuring a four or more alignment structure positions within each field of the orthogonal field structure, and aligning the feature or layer to the previously formed feature or layer based upon the measured alignment structure positions of the two or more continuous field structures and the orthogonal field structure.

In some embodiments a metrology system is disclosed, which comprises a measurement tool configured to measure an alignment structure position within the field on a wafer comprising a plurality of fields, wherein each field of the wafer comprises an identical configuration of alignment structure sites, and a computational unit configured to partition the plurality of fields into two or more continuous field structures, and instruct the measurement tool to measure an alignment structure site as a function of a field or continuous field structure wherein the alignment structure site is located.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of evaluating alignment of a feature or layer with a previously formed feature or layer on a face of a wafer, comprising:
    defining a plurality of fields on the face of the wafer, wherein each field includes a total predetermined number of alignment structure sites which are arranged in a predetermined pattern that is the same for each of the plurality of fields;
    organizing the plurality of fields into an orthogonal field structure and two or more continuous field structures, wherein the orthogonal field structure comprises fields which reside on first and second orthogonal axes and which are arranged near an outer edge of the wafer, and wherein each continuous field structure includes two or more adjacent fields that are separate from the orthogonal field structure and wherein the two or more continuous field structures are asymmetric about the first and second orthogonal axes;
    randomly selecting a first predetermined number of the alignment structure sites from the predetermined pattern within each field of the two or more continuous field structures, the first predetermined number being less than the total predetermined number;

measuring a first number of alignment structure positions at the first predetermined number of alignment structure sites, respectively, within each field of the two or more continuous field structures;

selecting a second predetermined number of alignment structure sites from the predetermined pattern within each field of the orthogonal field structure, the second predetermined number being greater than the first predetermined number;

measuring a second number of alignment structure positions at the second predetermined number of alignment structure sites, respectively, within each field of the orthogonal field structure; and aligning the feature or layer to the previously formed feature or layer based upon the measured alignment structure positions of the two or more continuous field structures and the orthogonal field structure.

2. The method of claim 1, wherein the first predetermined number is between one and three for each field of the two or more continuous field structures, and wherein the second predetermined number is four or more for each field of the orthogonal field structure.

3. The method of claim 1, wherein the orthogonal field structure further comprises a field at a center of the wafer and at which the first and second orthogonal axes intersect.

4. The method of claim 1, wherein the two or more continuous field structures each include a predetermined number of fields, and wherein the predetermined number of fields for a continuous field structure are arranged to include consecutive adjacent fields in a direction of the first orthogonal axis.

5. The method of claim 1, wherein the measured alignment structure positions comprise a subset of a fixed number of alignment structure sites within each field.

6. The method of claim 5, wherein the alignment structure positions of all alignment structure sites are measured within the orthogonal field structure.

7. The method of claim 5, wherein measuring at least one alignment structure position within each field within a continuous field structure further comprises measuring a different alignment structure site within each field within the continuous field structure until all alignment structure sites have been measured within the continuous field structure.

8. The method of claim 5, wherein a number of fields within a continuous field structure is equal to the fixed number of alignment structure sites.

9. The method of claim 8, wherein a sum of a product of the number of continuous field structures and the number of alignment structure sites, summed with a number of orthogonal fields, is equal to a total number of fields on the wafer.

10. The method of claim 5, wherein the fixed number of alignment structure sites comprise an identical configuration within each field.

11. The method of claim 1:
wherein the plurality of fields are arranged in rows and columns on the face of the wafer; and
wherein a continuous field structure includes a plurality of adjacent fields extending continuously from an intermediate location on a row or column to an outermost edge of the row or column, the plurality of adjacent fields continuing continuously along a neighboring row or column from a location on the neighboring row or column nearest the outermost edge to an intermediate location on the neighboring row or column.

12. A method of alignment on a wafer comprising a plurality of adjacent fields on a face of the wafer, comprising:
organizing the plurality of adjacent fields into an orthogonal field structure and two or more continuous field structures, wherein the orthogonal field structure is made up of fields which reside on first and second orthogonal axes and which are arranged near an outer edge of the wafer and at a center of the wafer, and wherein each continuous field structure includes two or more adjacent fields that are separate from the orthogonal field structure, and wherein each field of the plurality of adjacent fields includes a predetermined number of alignment structure sites which are arranged in a predetermined pattern that is the same for each of the plurality of adjacent fields;
randomly selecting at least one of the alignment structure sites from the predetermined pattern within each field of the two or more continuous field structures;
measuring at least one alignment structure position for the at least one respective alignment structure site within each field of the two or more continuous field structures;
selecting four or more of the alignment structure sites from the predetermined pattern within each field of the two or more orthogonal field structures;
measuring four or more alignment structure positions for the four or more alignment structure sites, respectively, within each field of the orthogonal field structure; and
aligning a feature of layer disposed on a mask to a previously formed feature or layer disposed on the face based upon the measured alignment structure positions of the two or more continuous field structures and the orthogonal structure.

13. The method of claim 12, wherein measuring at least one alignment structure position within each field of the two or more continuous field structures comprises measuring a different alignment structure site within each field within the continuous field structure until all alignment structure sites have been measured within the continuous field structure.

14. The method of claim 12, wherein the two or more continuous field structures each include a predetermined number of fields, and wherein the predetermined number of fields for a continuous field structure are arranged to include consecutive fields in a direction of the first orthogonal axis.

15. The method of claim 12, wherein the alignment structure positions of the alignment structure sites are measured within the orthogonal field structure.

16. The method of claim 12, wherein measured alignment structure positions are utilized to model a map of wafer topography comprising modeled alignment structure locations.

17. The method of claim 12:
wherein the plurality of adjacent fields are arranged in rows and columns on the face of the wafer; and
wherein a continuous field structure includes a plurality of adjacent fields extending continuously from an intermediate location on a row or column to an outermost edge of the row or column, the plurality of adjacent fields continuing continuously along a neighboring row or column from a location on the neighboring row or column nearest the outermost edge to an intermediate location on the neighboring row or column.

18. A method, comprising:

receiving a wafer which includes a previously patterned layer and a newly patterned layer, wherein the newly patterned layer includes features to be aligned with features on the previously patterned layer, wherein a first plurality of fields and a second plurality of fields are dispersed over a face of the wafer and wherein each field of the first and second plurality of fields includes a total predetermined number of alignment structure sites which are arranged in a predetermined pattern that is the same for each field of the first and second plurality of fields;

randomly selecting a first predetermined number of alignment structure sites from the predetermined pattern within each field of the first plurality of fields, the first predetermined number being less than the total predetermined number;

measuring alignment between the features of the previously patterned layer and the features of the newly patterned layer at the first predetermined number of alignment structure sites, the first plurality of fields including at least two adjacent fields which directly contact one another and which run in parallel with a first axis; and selecting a second predetermined number of alignment structure sites from the predetermined pattern within each field of the second plurality of fields;

measuring alignment between the features of the previously patterned layer and the features of the newly patterned layer at the second predetermined number of alignment structure sites, wherein the second plurality of fields is made up exclusively of fields which lie on the first axis or a second axis orthogonal to the first axis on the face of the wafer, the second predetermined number being greater than the first predetermined number;

wherein the at least two consecutive adjacent fields are asymmetric about the first and second axes.

19. The method of claim 18, wherein the first plurality of fields covers all reticle fields or die on the wafer except for the reticle fields or die which are covered by the second plurality of fields.

20. The method of claim 18, wherein measuring alignment between the features of the previously patterned layer and the features of the newly patterned layer at the first predetermined number of alignment structure sites corresponds to measuring alignment at a single alignment structure site within each of the first plurality of fields, and wherein measuring alignment between the features of the previously patterned layer and the features of the newly patterned layer at the second predetermined number of alignment structure sites corresponding to measuring alignment at multiple alignment structure sites within each of the second plurality of fields.

* * * * *